United States Patent [19]

Anderson et al.

[11] Patent Number: 4,791,632
[45] Date of Patent: Dec. 13, 1988

[54] COMPENSATED LASER DIODE TRANSMITTER

[75] Inventors: David R. Anderson, Murray; Vaughn J. Jenkins, Bountiful, both of Utah

[73] Assignee: Sperry Corporation, Blue Bell, Pa.

[21] Appl. No.: 1,796

[22] Filed: Jan. 9, 1987

[51] Int. Cl.[4] ............................................. H01S 3/13
[52] U.S. Cl. ...................................... 372/31; 372/38; 455/609
[58] Field of Search ..................... 372/29, 31, 33, 34, 372/38; 455/609, 613

[56] References Cited

U.S. PATENT DOCUMENTS 4,709,416 11/1987 Patterson .......................... 455/609

FOREIGN PATENT DOCUMENTS 0054281 3/1984 Japan ................................ 372/34
2045516 10/1980 United Kingdom .................. 372/29

OTHER PUBLICATIONS

D. C. Thomas, Jr. et al, "Digital Feedback Light-Emitting Diode Control", vol. 16, No. 8, Jan. 1974; IBM Technical Disclosure Bulletin; pp. 2598–2600.
Sharp "Laser Diodes Users Manual" @p. 26; No. © Notice; Pub. Date Sep. 1986.
Hitachi "Opto Electronic Devices Data Book" @p. 20; No. © Notice; Pub. Date Sep. 1984.

Primary Examiner—William L. Sikes
Assistant Examiner—B. Randolph
Attorney, Agent, or Firm—John B. Sowell; L. J. Marhoefer; T. J. Scott

[57] ABSTRACT

A compensated laser diode transmitter for high speed data transmission is provided with a pair of current switches, a novel current summing circuit and a novel current sink. The power output of the laser is sensed in real data time and employed to generate instantaneous feedback signals capable of instantaneously rebalancing and maintaining the power output of the laser diode.

11 Claims, 3 Drawing Sheets

COMPENSATED LASER DIODE TRANSMITTER

BACKGROUND OF THE INVENTION

1. Field of the Invention

This invention relates to a novel laser diode transmitter. More particularly, the present invention relates to a circuit which instaneously and properly compensates for temperature and aging changes to maintain the laser optical power output constant.

2. Description of the Prior Art

Laser diode transmitters were known heretofore to be provided with feedback circuits. Such prior art feedback circuits attempted to maintain the laser optical power constant to compensate for temperature and aging changes, however, when the duty cycle of the high speed data stream being applied to the transmitter was less than approximately twenty percent, the prior art feedback circuits did not properly compensate for the temperature and aging changes and caused distortion of the laser optical power output.

Accordingly, it would be desirable to provide a laser diode transmitter with a compensating circuit which is responsive to a high speed data stream and which instantaneously compensates for temperature and aging changes so as to maintain the laser optical power output constant and is insensitive to the duty cycle of the data stream.

SUMMARY OF THE INVENTION

It is a principal object of the present invention to provide a novel laser diode transmitter.

It is another principal object of the present invention to provide a high speed compensation circuit for a laser diode transmitter which maintains the laser optical power output constant.

It is another object of the present invention to provide a novel high speed compensation circuit for a laser diode transmitter which is not sensitive to the duty cycle of the input data.

It is yet another object of the present invention to provide a high speed feedback compensation circuit for changing the operating current of a laser diode to maintain laser optical power output constant.

It is a general object of the present invention to provide a compensation circuit for a laser diode which is simple in design and has fewer components than prior art circuits.

According to these and other objects of the present invention, there is provided a novel compensation circuit for a laser diode transmitter having a pair of current switches, a current summing circuit and a current sink circuit for sensing the laser diode power output and compensating the input current to the laser diode.

DESCRIPTION OF THE PREFERRED EMBODIMENT

Figure 1:
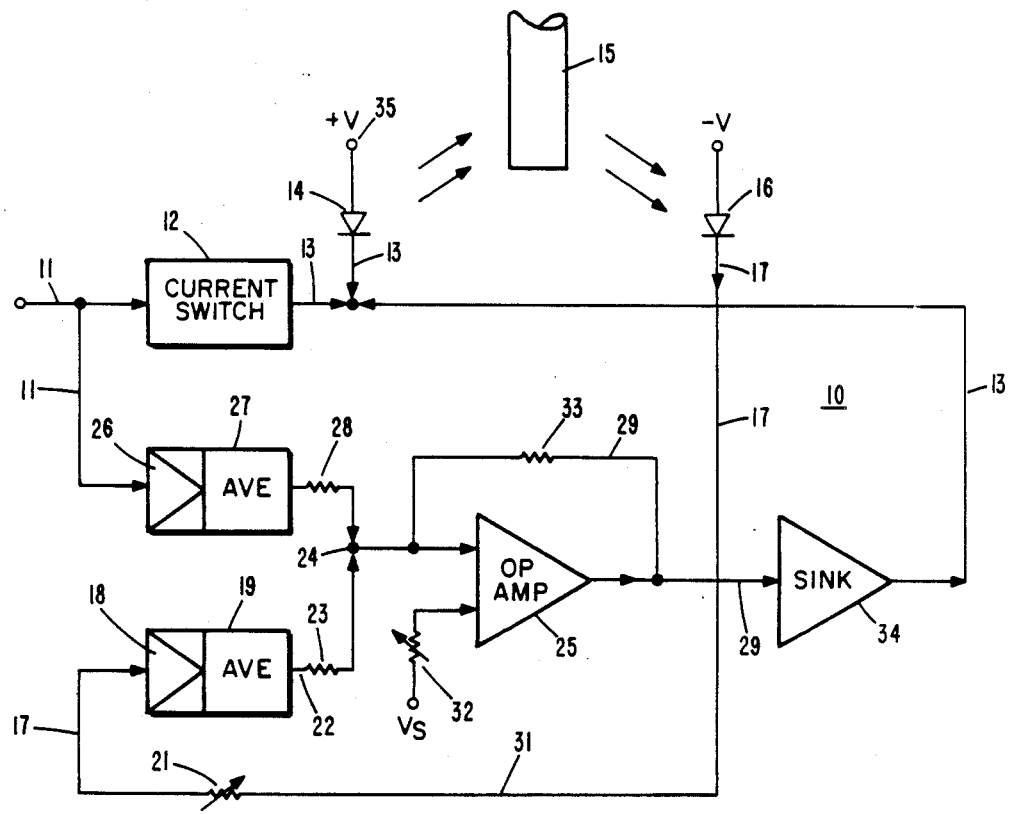
FIG. 1 is a schematic block diagram showing a typical prior art compensated laser diode transmitter which is sensitive to the input data pattern.

Refer now to FIG. 1 showing a typical prior art laser diode transmitter having a feedback compensation circuit which is sensitive to the input data pattern. The laser diode transmitter 10 has a data stream applied to the input line 11. The data stream is shaped and current amplified in current switch 12 to produce current on output line 13 sufficient to drive laser diode 14 into the lasing mode. The laser diode 14 emits light which is conducted through fiber optic cable 15 to a receiver which is not shown. The light from diode 14 is picked up and sensed by photodiode 16 which is located in the close proximity to diode 14 and fiber optic cable 15. Light from laser diode 14 causes a current output from photodiode 16 on line 17 which is fed back to operational amplifier 18 which comprises an averaging circuit 19. A gain adjustment 21 is provided in series in line 17 to affect the gain of operational amplifier 18. The output of the averaging circuit 19 on line 22 is applied to a summing resistor 23 and to the node 24 which is connected to the voltage summing node shown as a minus input of the operational amplifier 25. The input data on line 11 is also applied to the operational amplifier 26 which averages the input data at averaging circuit 27 before applying the average value of the input data to the node 24 via summing resistor 28. If the average of the data from averaging circuit 27 is equal and opposite to the average of the averaged feedback from averaging circuit 19, there is no change at the negative summing mode of operational amplifier 25. Thus, if the inputs to node 24 are equal and opposite, there is no output on line 29 from operational amplifier 25. An offset voltage $V_S$ is provided at terminal 31 and adjusted by potentiometer 32 before being applied to the non inverting input (shown as the positive input) of the operational amplifier 25. A resistor 33 is shown in feedback line 29 connected to the inverting (negative) input of the operational amplifier 25 to set the gain. The output from operational amplifier 25 on line 29 is connected to a voltage control sink 34. The output from the sink 34 is applied to the current switch output current line 13 which is an input to the laser diode 14. As the temperture or age of the laser diode 14 increases, the optical light power output diminishes. The detected light output at photodiodes 16 diminishes and the current on line 17 applied to operational amplifier 18 is diminished. Assuming that the data rate on input line 11 has been unchanged, the voltage at the output averaging circuit 27 is unchanged and the voltage output on line 22 has been reduced. This results in a more negative voltage at node 24 and at the input of the inverting input of operational amplifier 25. A more positive signal is generated on the output line 29. The increased voltage on line 29 is fed back through a feedback resistor 33 which results in balancing the voltage at the inverting input of operational amplifier 25. The increased voltage on line 29 is also applied to the current sink 34 which now draws more current through the current switch output current line 13. This results in drawing more current from the positive voltage source at terminal 35 through laser diode 14, thus, increasing the power output of laser diode 14.

Having explained the operation of a simplified prior art feedback circuit, it will now be understood that the input data on line 11 is being amplified at amplifier 26 and averaged at averaging circuit 27 before being applied to summing circuit via resistor 28. If the duty cycle of the data appearing on input line 11 has a fifty percent duty cycle, then the voltage at summing resistor 28 is not effected by the duty cycle, however, when the duty cycle falls below approximately twenty percent, the voltage appearing at summing resistor 28 is effected by the duty cycle. If the duty cycle of the input data is less than approximately twenty percent, then the resultant voltage at node 24 is reduced which results in reducing the threshold current in laser diode 14. If the duty cycle of the data on input line 11 increases beyond approximately eighty percent, then there is an increase of the voltage at node 24 which causes an increase in the current in diode 14. Thus, it will be understood that a low duty cycle will cause the laser diode to diminish in optical power output when no aging or no temperature change has occurred. Similarly, a very high duty cycle causes the laser diode 14 to emit more optical power which, in turn, does cause a temperature increase in the laser 14. The end result of producing too much power or too little power at laser diode 14 is to cause distortion of the optical power output signal being applied to the fiber optic cable 15.

Figure 2:
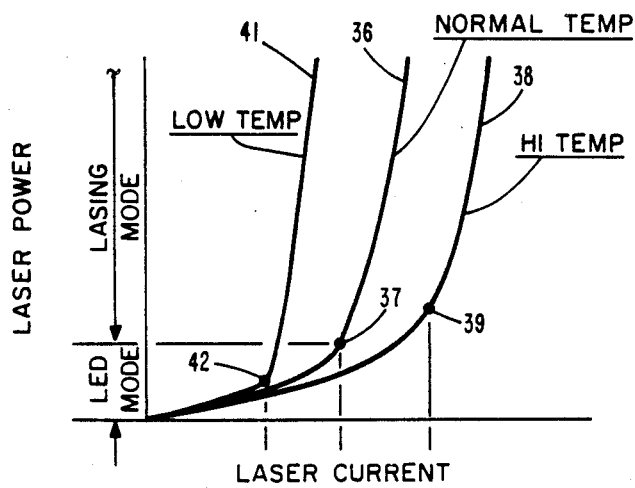
FIG. 2 is a family of characteristic curves showing the lasing threshold for a typical laser diode.

Refer now to FIG. 2 showing a family of characteristic curves for a typical laser diode. Curve 36 shows a normal current versus laser power output curve under normal temperature conditions. The curve 36 has a knee or threshold point at 37 which the laser diode goes into the lasing mode. When the temperature increases as shown at curve 38, the knee 39 occurs at a higher current level and requires additional power to drive the diode into the lasing mode. In the preferred embodiment of the present invention, it is desired that the laser diode 14 be maintained at the knee of the current-power curve so that the time required for driving the laser diode into the lasing mode is substantially reduced. Curve 41 is shown having a knee 42 which is substantially below the knee of curves 36 and 38. If the prior art type compensation circuit was employed for instantaneous response, it would be possible to drive the laser diode 14 into the lasing mode when the data input was requiring the non lasing mode. Thus, it will be understood that the prior art circuit in FIG. 1 must be placed lower in the LED mode of operation to avoid the possibility of the laser diode being placed in the lasing mode as a result of the unbalance of the duty cycle. Characteristic curve 36 is shown as a normal temperature characteristic curve. The high temperature characteristic curve 38 illustrates that additional current is required in the laser diode 14 when the higher temperature of the laser diode 14 occurs. Similarly, when the laser diode 14 ages, it has the same effect as a higher temperature and additional current is required to drive the laser diode into the lasing mode. Assume, for example, that the original prior art circuit was set close to the knee 37 and that aging or temperature increase has occurred. It is then necessary to increase the current substantially just to drive the laser diode at the higher threshold current level to maintain the proper switching operation. The laser diode 14 would malfunction if low temperatures were encountered as shown by curve 41.

Figure 3:
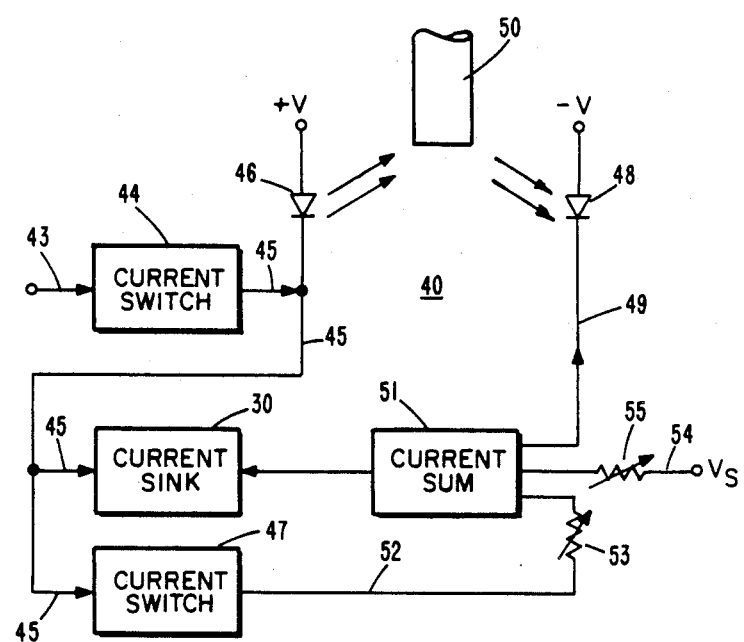
FIG. 3 is a schematic block diagram showing the present invention fully compensated laser diode transmitter which has instantaneous feedback compensation.

Refer now to FIG. 3 showing a schematic block diagram of the present invention fully compensated laser diode transmitter 40 which provides instantaneous feedback and positive compensation. The input data on line 43 is applied to a current switch 44 to produce an output on line 45 which is applied to laser diode 46. The operation of this portion of the circuit is substantially the same as that explained heretofore in the prior art device. The laser diode 46 produces a light output which is sensed at fiber optic cable 50 and at the photodiode 48. The output on line 45 is applied to a novel current sink 30 and to a novel current switch 47. The light which is sensed at photodiode 48 produces a current on line 49 which is applied to a novel current summing circuit 51. The output from the current switch 47 on line 52 is applied through a balance potentiometer 53 before being applied to the current summing circuit 51. This potentiometer balances the current in line 49 from the photodiode 48. A positive voltage source $V_S$ on line 54 is applied through an adjustable potentiometer 55 to provide a current for the current summing circuit 51 to set the threshold of the laser diode 46. The novel circuit shown in FIG. 3 does not employ averaging circuits or operational amplifiers which have feedback filters. This results in a high speed switching circuit which is not sensitive to the duty cycle of the data on the input line 43.

Figure 4:
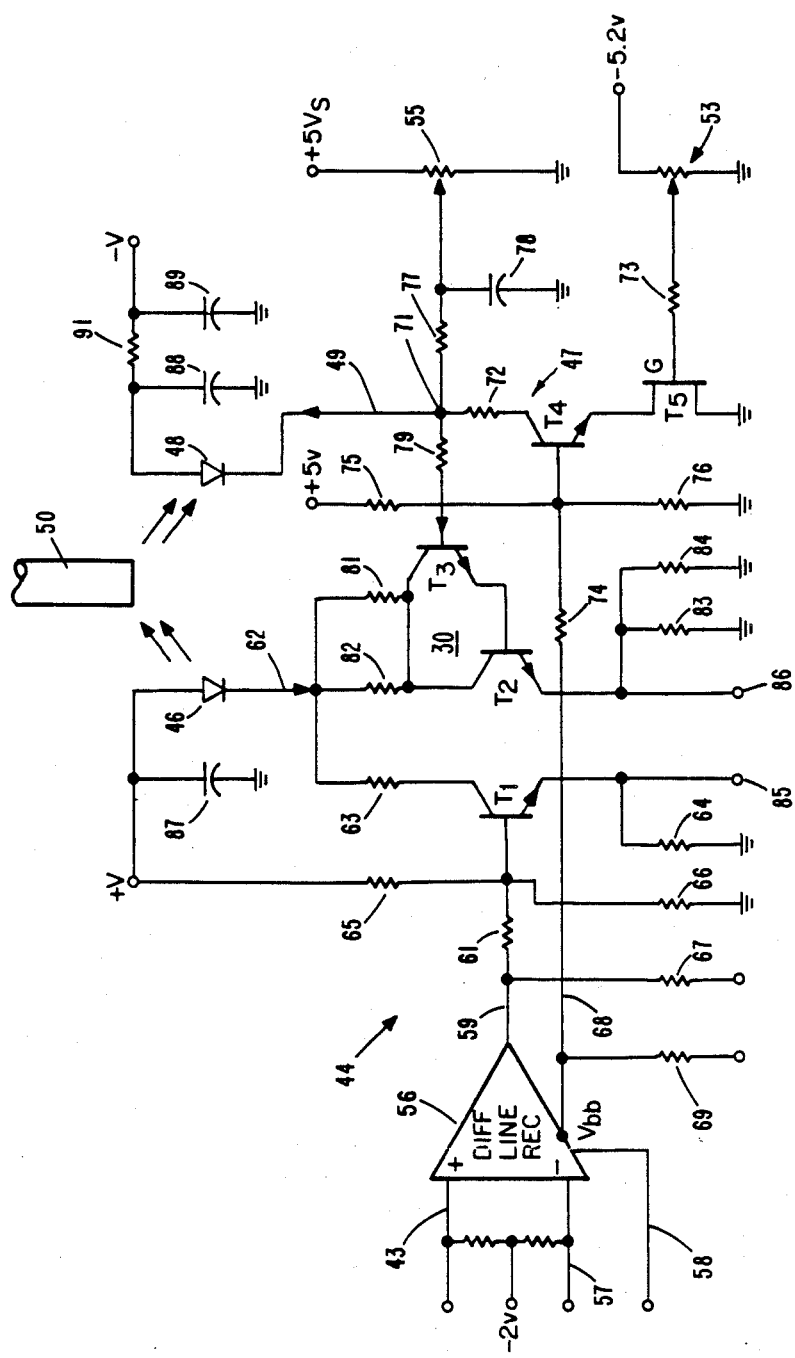
FIG. 4 is a circuit diagram of the present invention laser diode transmitter shown in FIG. 3.

Refer now to FIG. 4 which is a circuit diagram of the block diagram shown in FIG. 3. The input line 43 is shown connected to a differential line receiver 56 at the non inverting input. Input line 57, shown connected to the inverting input of receiver 56, is employed when a differential data input is used. When a single ended input is desired, the input line 57 is eliminated and the bias level voltage $V_{bb}$ on line 58 is applied to the inverting input of the receiver 56. The output from receiver 56 on line 59 is connected to the base of transistor T1 via the base resistor 61. When transistor T1 is turned ON, current is pulled from the positive voltage supply $+V$ through the laser diode 46 and via line 62 and load resistor 63 through the transistor T1 and the emitter resistor 64 to ground. Resistor 65 is shown connected between the voltage source $+V$ and the base of transistor T1. Resistors 61, 66 and 67 are shown connected to resistor 65 and form a level shifting network therewith to establish the voltage at the base of transistor T1. Inverted output line 68 from receiver 56 is shown connected to resistor 69 which serves to balance the current on line 68 similar to resistor 67 mentioned hereinbefore. The current switch 44 shown in FIG. 3 will now be understood to comprise the circuitry associated with the differential line receiver 56 and transistor T1 as explained hereinbefore. The current switch 44 causes the laser diode 46 to emit light which is received by the fiber optic cable 50 and also sensed by the photodiode 48. Light sensed by the photodiode 48 produces a current output on line 49 which is connected to a node 71. A balancing circuit comprises a resistor 72, transistor T4 and transistor T5. The gate of transistor T5 is shown connected via resistor 73 to the aforementioned potentiometer balancing circuit 53. Balance potentiometer 53 is shown connected between a negative voltage and ground. The voltage applied to the gate of transistor T5 determines the resistance of the transistor T5 from node 71 to ground and in effect, becomes a variable resistance in the emitter to ground circuit of transistor T4. The current in the balancing circuit matches equal and opposite the current from photodiode 48 being applied to node 71. The inverted output on line 68 from receiver 56 is applied to the base of transistor T4 via base resistor 74. A base bias resistor 75 is connected to a bias voltage and to the base of transistor T4. Resistors 69, 74 and 76 form a voltage divider with resistor 75 to bias the base of transistor T4. It will be understood that the signal on output line 68 is the inverted version of the signal on output line 59 and that when the output signal on line 59 has transistor T1 in the OFF state, that transistor T4 is ON. When transistor T4 is ON, it effects the current at the summing node 71. The node 71, in effect becomes the current summing circuit 51 shown in FIG. 3. The aforementioned biasing potentiometer 55 is shown connected between the voltage source $V_S$ and ground. The wiper of the potentiometer 55 is shown connected to a resistor 77 and to the node 71. When current is being supplied from the photodiode 48, the resistor 77 serves as a load resistor for the current path through the capacitor 78 to ground and as a current input resistor for the wiper of the potentiometer 55. Functionally, the potentiometer 55 serves to set the base current level of transistor T3 via base resistor 79. When transistor T3 is ON, the parallel load resistors 81 and 82 provide a path from the laser diode 46 to the darlington pair transistors T2 and T3 which are in effect, the current sink 30. When transistor T2 is turned ON, the current through transistor T2 is conducted to ground via the emitter resistors 83 and 84. Terminals 85 and 86 are provided as test points to provide means for measuring the threshold current of the laser diode and the laser diode signal current through transistor T1. Capacitors 87, 88 and 89 and resistor 91 are provided as filtering components for the voltage supplies to the laser diode 46 and photodiode 48.

In the preferred mode of operation, bias potentiometer 55 is set so that the threshold current of laser diode 46 is at the knee of the aforementioned characteristic curve. After an input signal is applied to the receiver 56 to cause the laser diode 46 to conduct, it is possible to adjust the balance potentiometer 53 so that test point 86, which is connected to the emitter of transistor T2, does not change level as a result of the input signals. Thus, the voltage at test point 86 must maintain its level with or without the input data on line 43. Once the potentiometer 53 is balanced, and the aforementioned biasing voltage is set for the threshold level of the laser diode at its present operating condition, the laser diode transmitter is self-compensating without dependency on the duty cycle of the input data.

Input data on line 43 results in operation of the laser diode 46 and causes the photodiode 48 to produce a current on its output line 49 which is applied to node 71. When output line 59 turns laser diode 46 ON, transistor T4, which acts as the current switch 47, is turned OFF and the current balance is maintained at the proper threshold by the previous setting of potentiometer 55. Thus, there is no change in the current being applied to the base of transistor T3. When the laser diode 46 has a diminished light output as a result of increased temperature or aging as explained hereinbefore, the photodiode 48 receives less light and produces less current on line 49 which results in an increase of the base current on transistor T3. When transistor T3 conducts, it increases the current on line 62 and in laser diode 46 which causes an increase in the light output being sensed by teh photodiode 48, thus, resulting in a rebalancing of the feedback circuit instantaneously and independent of the duty cycle of the input data.

Having explained a preferred embodiment of the present invention, laser diode transmitter with instantaneous feedback compensation, it will be understood that there are no operational amplifiers or averaging circuits which would affect distortion at low duty cycle rates.

We claim:

1. A compensated laser diode transmitter for high-speed data transmission comprising:
   an input current switch for receiving data signals to be transmitted,
   a laser diode coupled to the output of said input current switch and responsive to said data signals for energizing said laser diode into a lasding mode for emitting optical signals,
   a photodiode mounted in close proximity to said laser diode for generating output signals in response to said optical signals,
   an output node summing circuit connected to the output signals of said photodiode,
   a current sink coupled to said laser diode and to said output node of said photodiode and responsive to the current at the output of said photodiode,
   threshold current biasing means connected to said output node for setting the threshold current of said laser diode, and
   current switch means operable by said data signals and coupled to the output of said input current switch and to said output node of said photodiode for balancing the increase in current from said photodiode to continuously maintain a predetermined threshold level when said laser diode is conducting so that changes in the output power of said laser diode are sensed and instantaneously rebalanced by said input current switch to maintain the power output of said laser diode constant.

2. A compensated laser diode transmitter as set forth in claim 1 wherein said input current switch comprises a differential line receiver coupled to a first transistor, said first transistor being driven into a current state by data signals received at said input current switch.

3. A compensated laser diode transmitter as set forth in claim 2 wherein said current sink comprises a second transistor in parallel with said first transistor.

4. A compensated laser diode transmitter as set forth in claim 3 wherein said current sink further includes a third transistor in series with said second transistor.

5. A compensated laser diode transmitter as set forth in claim 4 wherein said current switch means comprises a fourth transistor coupled between said output node and ground.

6. A compensated laser diode transmitter as set forth in claim 5 wherein said current switch means further includes a fifth transistor in series with said fourth transistor.

7. A compensated laser diode transmitter as set forth in claim 6 wherein said current switch means further includes a balance potentiometer coupled to the control electrode of said fifth transistor.

8. A compensated laser diode transmitter as set forth in claim 1 wherein said threshold current biasing means comprises a potentiometer coupled to said output node and to a voltage source.

9. A compensated laser diode transmitter as set forth in claim 8 wherein said threshold current biasing means further includes a resistor in series with said potentiometer and said output node.

10. A compensated laser diode transmitter as set forth in claim 9 wherein said potentiometer of said threshold current biasing means is coupled between said voltage source and said resistor.

11. A compensated laser diode transmitter as set forth in claim 9 wherein said potentiometer is set to bias said laser diode at the current threshold of its characteristic curve just at the knee of the lasing mode.

* * * * *